United States Patent
Hanaoka et al.

(10) Patent No.: US 8,203,152 B2
(45) Date of Patent: Jun. 19, 2012

(54) NITRIDE SEMICONDUCTOR DEVICES INCLUDING A SEPARATION PREVENTING LAYER

(75) Inventors: Daisuke Hanaoka, Kyoto (JP); Masafumi Kondo, Kyoto (JP); Susumu Ohmi, Kyoto (JP); Kunihiro Takatani, Mihara (JP); Yoshika Kaneko, Funabashi (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/259,035

(22) Filed: Oct. 27, 2005

(65) Prior Publication Data

US 2006/0091501 A1    May 4, 2006

(30) Foreign Application Priority Data

Oct. 28, 2004 (JP) ................................. 2004-314319

(51) Int. Cl.
*H01L 33/00* (2010.01)

(52) U.S. Cl. .............. 257/79; 257/13; 257/94; 257/103; 257/615; 257/E33.055

(58) Field of Classification Search .................. 257/615, 257/613, 13, 14, 79, 94, 103, E33.001, E33.025, 257/E33.055, E33.06–E33.063, E31.11, E31.119, 257/E31.124
See application file for complete search history.

(56) References Cited

U.S. PATENT DOCUMENTS

| | | | |
|---|---|---|---|
| 6,172,382 B1 * | 1/2001 | Nagahama et al. | 257/94 |
| 6,586,762 B2 * | 7/2003 | Kozaki | 257/14 |
| 2003/0038294 A1 * | 2/2003 | Sano | 257/91 |
| 2005/0030999 A1 * | 2/2005 | Yoneda | 372/46 |

FOREIGN PATENT DOCUMENTS

| | | |
|---|---|---|
| JP | 11-150301 | 6/1999 |
| JP | 11-340571 | 12/1999 |
| JP | 2002-164575 | 6/2002 |
| JP | 2004-281431 | 10/2004 |
| JP | 2004-281432 | 10/2004 |
| JP | 2006-024703 | 1/2006 |

* cited by examiner

*Primary Examiner* — Anh Phung
*Assistant Examiner* — Allison P Bernstein
(74) *Attorney, Agent, or Firm* — Harness, Dickey & Pierce, P.L.C.

(57) ABSTRACT

The nitride semiconductor device includes an insulating layer and a metal layer formed on a nitride semiconductor layer. The insulating layer makes contact with the nitride semiconductor layer. A separation preventing layer is formed between the insulating layer and the metal layer so as to make contact with each of these layers. The separation preventing layer includes, as a main component, at least one oxide of a metal selected from a group of metals consisting of tungsten, molybdenum, chromium, titanium, nickel, hafnium, zinc, indium and yttrium.

20 Claims, 4 Drawing Sheets

NITRIDE SEMICONDUCTOR DEVICES INCLUDING A SEPARATION PREVENTING LAYER

Nitride Semiconductor Device and Manufacturing Method Thereof This nonprovisional application is based on Japanese Patent Application No. 2004-314319 filed with the Japan Patent Office on Oct. 28, 2004, the entire contents of which are hereby incorporated by reference.

BACKGROUND OF THE INVENTION

1. Field of the Invention

The present invention relates to a nitride semiconductor device and a manufacturing method of the same, and in particular, to a nitride semiconductor device that can be manufactured with good yield, and a manufacturing method of the same.

2. Description of the Background Art

An example of the structure of a conventional nitride semiconductor device is disclosed in, for example, Japanese Laid-Open Patent Publication No. 11-340571. FIG. 4 is a schematic cross-sectional view showing the conventional nitride semiconductor device which is disclosed in Japanese Laid-Open Patent Publication No. 11-340571. This nitride semiconductor device includes a nitride semiconductor substrate 400 made of a number of layers, an n-side clad layer 401 that is formed on one main surface of nitride semiconductor substrate 400, an n-side optical guide layer 402, an active layer 403, a p-side optical guide layer 404, a p-side clad layer 405, a p-side contact layer 406, an insulating film 407, a p-side electrode 408, an n-side contact layer 409 that is formed on the other main surface of nitride semiconductor substrate 400, and an n-side electrode 410 made of a number of layers. Here, insulating film 407 is made of $ZrO_2$, and p-side electrode 408 is made of Ni/Au (see paragraphs [0029] and [0030] of Japanese Laid-Open Patent Publication No. 11-340571).

Thus, n-side electrode 410 of this nitride semiconductor device is made to adhere to a heat sink (not shown) that is metalized with Au by applying heat and pressure, while an Au wire 411 is bonded to the top of p-side electrode 408.

SUMMARY OF THE INVENTION

In a manufacturing process of a nitride semiconductor device, in general, heat treatment at a high temperature is carried out after the formation of a p-side electrode, in order to achieve ohmic contact between the p-side electrode and a p-side contact layer. In this heat treatment, however, in some cases, the adhesion between the insulating layer and the p-side electrode deteriorates, and the p-side electrode is separated. In addition, even in the case where separation of the p-side electrode does not occur in this heat treatment, separation of the p-side electrode may occur during the subsequent polishing process or conductivity test using a probe, or bonding failure of an Au wire to the p-side electrode may occur. Accordingly, a problem where the manufacturing yield is poor arises in the conventional nitride semiconductor device.

An object of the present invention is to provide a nitride semiconductor device which can be manufactured with good yield, and a manufacturing method of the same.

The present invention provides a nitride semiconductor device which includes an insulating layer and a metal layer formed on a nitride semiconductor layer. Herein, the insulating layer makes contact with the nitride semiconductor layer, a separation preventing layer is formed between the insulating layer and the metal layer so as to make contact with each of these layers, and the separation preventing layer has, as a main component, at least one kind of oxide of a metal selected from the group consisting of tungsten, molybdenum, chromium, titanium, nickel, hafnium, zinc, indium and yttrium.

Here, in the nitride semiconductor device according to the present invention, preferably, the insulating layer is made of silicon oxide, aluminum oxide, zirconium oxide, tantalum oxide, magnesium oxide, calcium fluoride or magnesium fluoride.

In addition, in the nitride semiconductor device according to the present invention, preferably, the insulating layer is made of silicon oxide and the separation preventing layer is made of titanium oxide.

In addition, in the nitride semiconductor device according to the present invention, preferably, the metal layer has at least one contact surface that makes contact with said separation preventing layer, and the contact surface has, as a main component, at least one kind of metal selected from the group consisting of molybdenum, zirconium, hafnium, titanium, aluminum, tantalum and vanadium.

In addition, the nitride semiconductor device according to the present invention is preferably a laser diode having a ridge stripe portion that is formed by removing a part of the nitride semiconductor layer, and at least one portion of the sides of the ridge stripe portion is preferably filled in with the insulating layer.

The present invention also provides a manufacturing method of a nitride semiconductor device, which includes a step of forming an insulating layer on a nitride semiconductor layer, a step of forming a separation preventing layer having, as a main component, at least one kind of oxide of a metal selected from the group consisting of tungsten, molybdenum, chromium, titanium, nickel, hafnium, zinc, indium and yttrium on the insulating layer, and a step of forming a metal layer on the separation preventing layer.

Here, in the manufacturing method of a nitride semiconductor device according to the present invention, preferably, the insulating layer is made of silicon oxide, aluminum oxide, zirconium oxide, tantalum oxide, magnesium oxide, calcium fluoride or magnesium fluoride.

In addition, in the manufacturing method of a nitride semiconductor device according to the present invention, preferably, the insulating layer is made of silicon oxide and the separation preventing layer is made of titanium oxide.

In addition, in the manufacturing method of a nitride semiconductor device according to the present invention, preferably, the metal layer has at least one contact surface that makes contact with said separation preventing layer, and the contact surface has, as a main component, at least one kind of metal selected from the group consisting of molybdenum, zirconium, hafnium, titanium, aluminum, tantalum and vanadium.

In addition, the manufacturing method of a nitride semiconductor device according to the present invention preferably includes a first heat treatment step of heating the metal layer for 10 minutes or more at a temperature in a range between 150° C. or more and 300° C. or less after the step of forming the metal layer, and a second heat treatment step of heating the metal layer at a temperature in a range between 400° C. or more and 600° C. or less after the first heat treatment step.

Here, in the present specification, main component means that the total amount of the aforementioned oxide of a metal or the aforementioned metal is no less than 50 mol % of the entirety. Here, in the case where the layer is made up of two or more layers, the total amount of the aforementioned oxide of a metal or the aforementioned metal may be no less than 50 mol % of the entirety of each layer.

According to the present invention, it is possible to provide a nitride semiconductor device which can be manufactured with good yield, and a manufacturing method of the same.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
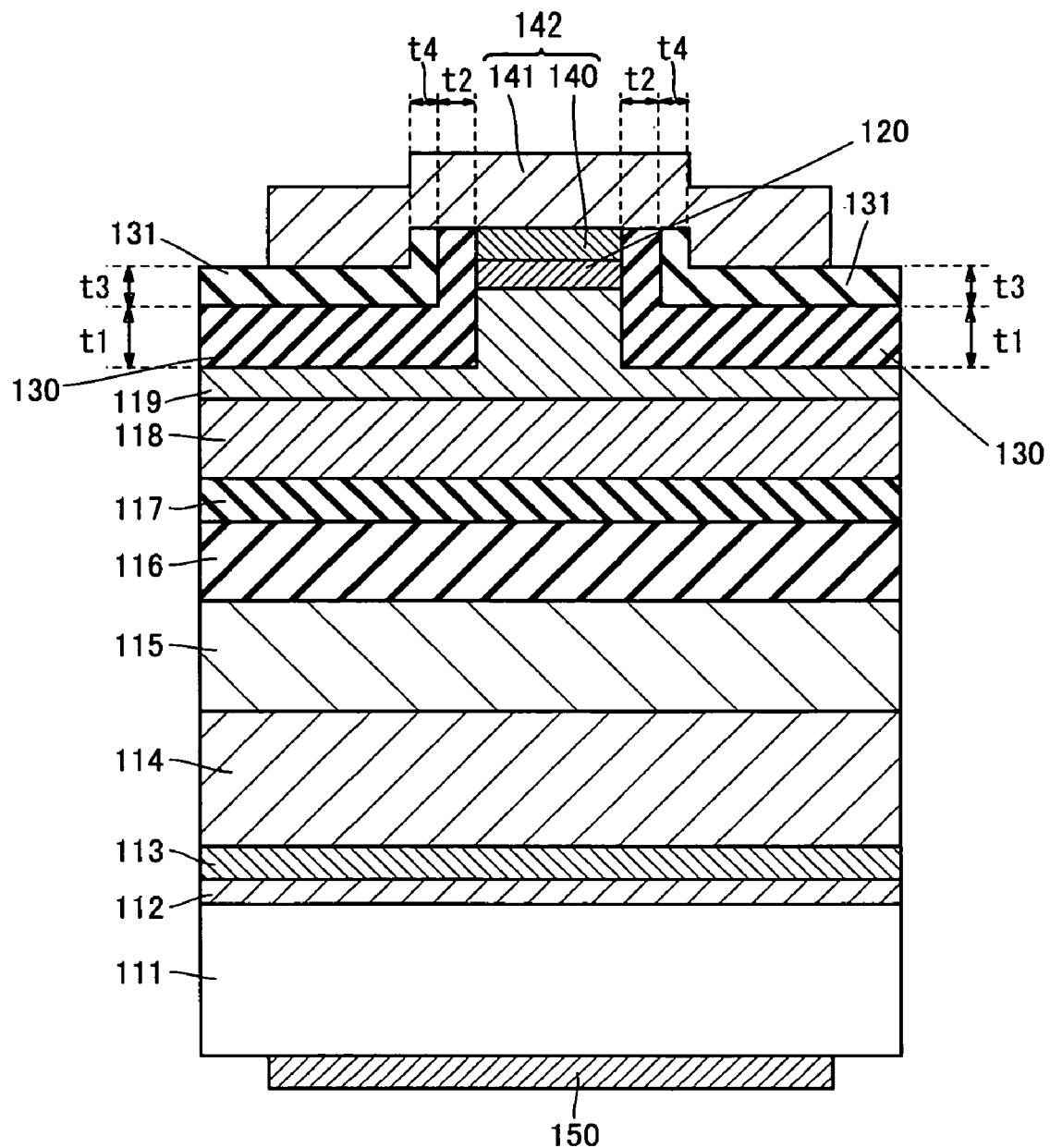
FIG. 1 is a schematic cross-sectional view showing a nitride semiconductor device according to Example 1 of the present invention.

In the following, the embodiments of the present invention are described. Here, the same reference symbols represent parts that are the same as or corresponding to the drawings of the present specification.

(Nitride Semiconductor Layer)

The nitride semiconductor layer that is used according to the present invention is made of a nitride semiconductor crystal, represented by the formula $Al_xGa_yIn_zN$ ($0 \leq x \leq 1$, $0 \leq y \leq 1$, $0 \leq z \leq 1$, $x+y+z=1$). Here, Al indicates aluminum, Ga indicates gallium, In indicates indium and N indicates nitrogen. In addition, x indicates the content of aluminum, y indicates the content of gallium, and z indicates the content of indium. Here, in the case where the nitride semiconductor crystal that forms the nitride semiconductor layer is a hexagonal crystal, 10% or less of the nitride element in the nitride semiconductor layer may be replaced with at least one kind of element of arsenic, phosphorous and antimony.

In addition, at least one kind from among, for example, silicon, oxygen, chlorine, sulfur, carbon, germanium, zinc, cadmium, magnesium and beryllium may be doped into the nitride semiconductor layer, so that the nitride semiconductor layer has either the p-type or n-type conductivity type.

In addition, the nitride semiconductor layer is made up of one or more layers, and at least one layer in the nitride semiconductor makes contact with the below described insulating layer.

(Insulating Layer)

The insulating layer that is used according to the present invention is formed on the aforementioned nitride semiconductor layer, and the insulating layer and the nitride semiconductor layer make contact with each other. Here, though the material of the insulating layer is not particularly limited, it is preferable that the insulating layer is made of silicon oxide, aluminum oxide, zirconium oxide, tantalum oxide, magnesium oxide, calcium fluoride or magnesium fluoride, in terms of increasing adhesion to the nitride semiconductor layer. In addition, the insulating layer may also be made of two or more layers instead of one.

(Separation Preventing Layer)

The separation preventing layer is formed between the aforementioned insulating layer and the below described metal layer so as to prevent separation of these layers. Here, the separation preventing layer has, as a main component, at least one kind of oxide of a metal selected from the group consisting of tungsten, molybdenum, chromium, titanium, nickel, hafnium, zinc, indium and yttrium. Such a material is used in the separation preventing layer, and thereby, separation between the insulating layer and the metal layer can be effectively prevented. In particular, in the case where the insulating layer is made of silicon oxide, it is preferable that the separation preventing layer is made of titanium oxide, in terms of improving the effect of preventing separation. In addition, the separation preventing layer may also be made of two or more layers instead of one.

(Metal Layer)

The metal layer that is used according to the present invention may be made of one layer, or two or more layers. The metal layer needs to have at least one contact surface that makes contact with the aforementioned separation preventing layer. In addition, the contact surface that makes contact with the separation preventing layer may make contact with at least one of the aforementioned nitride semiconductor layer and insulating layer. Furthermore, an uncontact surface that does not make contact with the separation preventing layer may make contact with at least one of the nitride semiconductor layer and the insulating layer.

In addition, it is preferable that the contact surface that makes contact with the separation preventing layer has, as a main component, at least one kind of metal selected from the group consisting of molybdenum, zirconium, hafnium, titanium, aluminum, tantalum and vanadium. This tends to make it possible to further increase the adhesion to the separation preventing layer.

It is preferable to carry out first heat treatment where the metal layer is heated for 10 minutes or more at a temperature in a range between 150° C. or more and 300° C. or less after the formation of the metal layer. This first heat treatment tends to make it possible to further increase the adhesion between the nitride semiconductor layer, the insulating layer, the separation preventing layer and the metal layer. Here, in the case where the temperature of the first heat treatment is less than 150° C., the effects of the first heat treatment tend not to be gained. Meanwhile, in the case where the temperature of the first heat treatment is higher than 300° C., damage to the nitride semiconductor element tends to become too great.

Furthermore, it is preferable that second heat treatment where the metal layer is heated at a temperature in a range between 400° C. or more and 600° C. or less is carried out after the first heat treatment. This second heat treatment tends to make it possible to improve the ohmic contact between the metal layer and the nitride semiconductor layer. Here, the second heat treatment is carried out after the adhesion between the nitride semiconductor layer, the insulating layer, the separation preventing layer and the metal layer has been improved as a result of the first heat treatment, and therefore, it becomes difficult to cause the metal layer to separate by the second heat treatment. Here, in the case where the temperature of the second heat treatment is less than 400° C., the effects of improving ohmic contact tend not to be gained. Meanwhile, in the case where the temperature of the second heat treatment is higher than 600° C., ohmic contact tends to deteriorate, rather than improve, and in addition, damage to the nitride semiconductor element tends to be too great.

(Nitride Semiconductor Device)

The nitride semiconductor device according to the present invention is appropriate for use as, for example, a light emitting element, such as a light emitting diode (LED), a laser diode (LD) or a super luminescent diode (SLD), a light receiving device, such as an optical sensor or a solar battery, or an electronic device, such as a transistor or a power device.

EXAMPLES

In the following, the examples of the present invention are descried, but the present invention is not limited to these. In addition, in the following, the nitride semiconductor layer made of a nitride semiconductor crystal that is represented by the formula $Al_xGa_yN$ ($0 \leqq x \leqq 1$, $0 \leqq y \leqq 1$, $x+y=1$) is simply referred to as AlGaN layer.

Example 1

FIG. 1 is a schematic cross-sectional view showing a nitride semiconductor device according to the present example. This nitride semiconductor device was fabricated as follows. First, a buffer layer 112, an n-type GaN layer 113, an n-type AlGaN clad layer 114, an n-type GaN guide layer 115, an active layer 116, an AlGaN layer 117, a p-type GaN guide layer 118, a p-type AlGaN clad layer 119, and a p-type GaN contact layer 120 were layered in this order on an n-type GaN substrate 111.

Next, a p-side first metal layer 140 which can make ohmic contact with p-type GaN contact layer 120, was formed on p-type GaN contact layer 120. Here, p-side first metal layer 140 was formed by layering a palladium layer having a thickness of 15 nm and a molybdenum layer having a thickness of 15 nm in this order on p-type GaN contact layer 120. After that, p-type AlGaN clad layer 119, p-type GaN contact layer 120, and p-side first metal layer 140 were partially removed in a dry etching process using a photoresist mask, and thereby, a ridge stripe portion for narrowing an injected current (the portion formed of a protrusion of p-type AlGaN clad layer 119, p-type GaN contact layer 120 and p-side first metal layer 140 that are on top of the protrusion) was formed.

Then, an insulating layer 130 made of silicon oxide and a separation preventing layer 131 made of titanium oxide are layered in this order on the entire surface of p-type AlGaN clad layer 119 and p-side first metal layer 140, where insulating layer 130 was layered by means of a sputtering method and separation preventing layer 131 was layered by means of an electron beam vapor deposition method, and after that, parts thereof were removed so as to expose a surface of p-side first metal layer 140. As a result of this, as shown in FIG. 1, the sides of the ridge stripe portion from which the portions of p-type GaN contact layer 120 and p-type AlGaN clad layer 119 had been removed, were filled in with insulating layer 130 and separation preventing layer 131. Here, the thickness t1 of insulating layer 130 was 200 nm and the thickness of t2 of insulating layer 130 was 200 nm. In addition, the thickness t3 of separation preventing layer 131 was 50 nm and the thickness t4 of separation preventing layer 131 was 40 nm.

Subsequently, a p-side second metal layer 141 was formed on a part of separation preventing layer 131 and p-side first metal layer 140, and thereby, a p-side metal layer 142 was formed of p-side first metal layer 140 and p-side second metal layer 141. Here, p-side second metal layer 141 was formed by layering a molybdenum layer having a thickness of 8 nm and a gold layer having a thickness of 200 nm in this order.

Then, n-type GaN substrate 111 was made thinner by polishing and after that, an n-side metal layer 150 was formed on a part of n-type GaN substrate 111, and thereby, a wafer was formed. Afterwards, p-side metal layer 142 was heated for 30 minutes in a nitrogen atmosphere at 180° C., hereby carrying out the first heat treatment. Subsequently, the temperature of this nitrogen atmosphere was increased to 550° C. for 5 minutes, and p-side metal layer 142 was heated for 2 minutes at 550° C., hereby carrying out the second heat treatment. As a result of this, excellent ohmic contact was achieved between p-side metal layer 142 and p-type GaN contact layer 120. After the second heat treatment, the temperature of this nitrogen atmosphere was lowered to room temperature.

Then, finally, this wafer was divided into individual nitride semiconductor devices, and thereby, a number of nitride semiconductor devices which function as a laser diode were fabricated.

Figure 2:
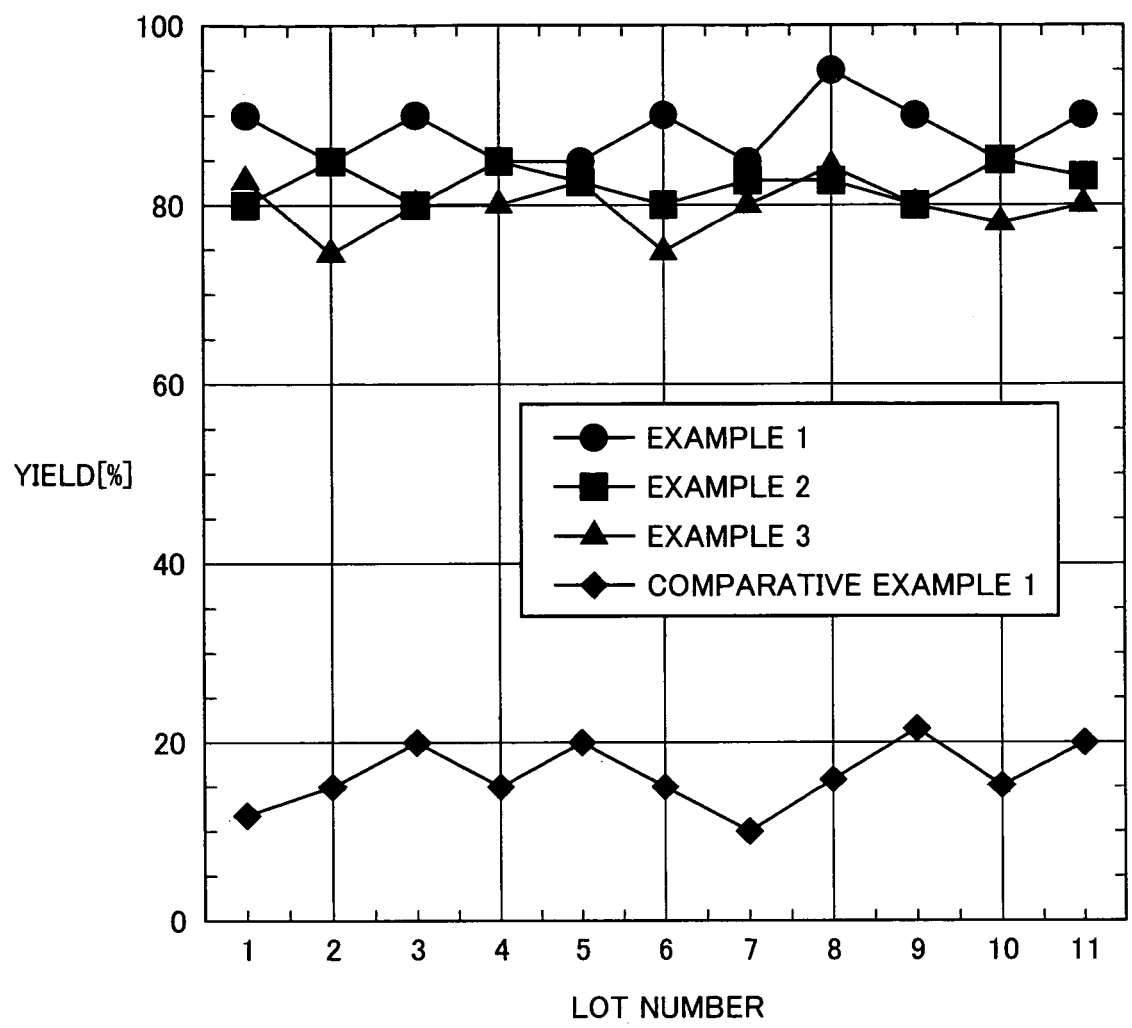
FIG. 2 is a graph showing the yield for each lot according to Examples 1 to 3 and Comparative Example 1 of the present invention.

Here, eleven lots (lot nos. 1 to 11) of wafers after the formation of the aforementioned n-side metal layer 150 were fabricated, and the yield of the nitride semiconductor devices which were respectively gained from these lots was inspected for each lot. The result of this is shown in FIG. 2. Here, the yield indicates a ratio of the nitride semiconductor devices where a separation of p-side second metal layer 141 or a failure of wire bonding to the top of p-side second metal layer 141 did not occur at the point in time when the nitride semiconductor devices were individually mounted in a package.

As shown in FIG. 2, according to Example 1, the nitride semiconductor devices were fabricated at a yield higher than 80 percent for all of the lots (lot nos. 1 to 11). In this manner, a high yield was gained according to Example 1 by virtue of the following possible reasons. Firstly, silicon oxide was used as the material of insulating layer 130, and thereby, it is possible that excellent adhesion between insulating layer 130 and p-type AlGaN clad layer 119 was achieved. Secondly, titanium oxide was used as the material of separation preventing layer 131, and thereby, it is possible that excellent adhesion between separation preventing layer 131 and p-side second metal layer 141 was achieved. Thirdly, p-side second metal layer 141 had the contact surface that makes contact with separation preventing layer 131 and the contact surface is made of molybdenum, and thereby, it is possible that adhesion between p-side second metal layer 141 and separation preventing layer 131 can further be increased.

Example 2

In the nitride semiconductor device shown in FIG. 1, a zirconium oxide layer was layered as insulating layer 130 and titanium oxide layer was layered as separation preventing layer 131. Here, the thickness t1 of insulating layer 130 was 150 nm and the thickness t2 of insulating layer 130 was 130 nm. In addition, the thickness t3 of separation preventing layer 131 was 100 nm and the thickness t4 of separation preventing layer 131 was 80 nm. Furthermore, a structure where a palladium layer having a thickness of 20 nm and a platinum layer having a thickness of 20 nm were layered in this order from the p-type GaN contact layer 120 side, was used for p-side first metal layer 140 and a structure where a titanium layer having a thickness of 10 nm and a gold layer having a thickness of 200 nm were layered in this order from the separation preventing layer 131 side, was used for p-side second metal layer 141. In addition, the first heat treatment was carried out on p-side metal layer 142 made of p-side first metal layer 140 and p-side second metal layer 141 for 20 minutes at 200° C. in a nitrogen atmosphere, and the temperature was increased to 550° C. for 5 minutes, and after that, the second heat treatment was carried out for 5 minutes at 550° C. In precisely the same manner as that of Example 1, except for the above description, the nitride semiconductor device according to Example 2 was manufactured.

The yield of the nitride semiconductor devices according to this Example 2 was inspected for each lot in the same manner as in Example 1. The result of this is shown in FIG. 2. As shown in FIG. 2, the nitride semiconductor devices were fabricated with a yield as high as 80% or more for each and every lot (lot nos. 1 to 11) according to Example 2.

Example 3

In the nitride semiconductor device shown in FIG. 1, a silicon oxide layer was layered as insulating layer 130 and a hafnium oxide layer was layered as separation preventing layer 131. Here, the thickness t1 of insulating layer 130 was 150 nm and the thickness t2 of insulating layer 130 was 150 nm. In addition, the thickness t3 of separation preventing layer 131 was 100 nm and the thickness t4 of separation preventing layer 131 was 80 nm. Furthermore, a structure where a nickel layer having a thickness of 15 nm and a molybdenum layer having a thickness of 20 nm were layered in this order from the p-type GaN contact layer 120 side was used for p-side first metal layer 140, and a structure where a hafnium layer having a thickness of 20 nm and a gold layer having a thickness of 200 nm were layered in this order from the separation preventing layer 131 side, was used for p-side second metal layer 141. In addition, the first heat treatment was carried out on p-side metal layer 142 made of p-side first metal layer 140 and p-side second metal layer 141 for 60 minutes at 150° C. in a nitrogen atmosphere, and the temperature was increased to 550° C. for 5 minutes, and after that, the second heat treatment was carried out for 5 minutes at 550° C. In precisely the same manner as that of Example 1, except for the above description, the nitride semiconductor devices according to Example 3 were fabricated.

The yield of the nitride semiconductor devices according to this Example 3 was inspected for each lot in the same manner as in Example 1. The result of this is shown in FIG. 2. As shown in FIG. 2, the nitride semiconductor devices were fabricated with a yield as high as 70% or more for each and every lot (lot nos. 1 to 11) according to Example 3.

Comparative Example 1

Figure 3:
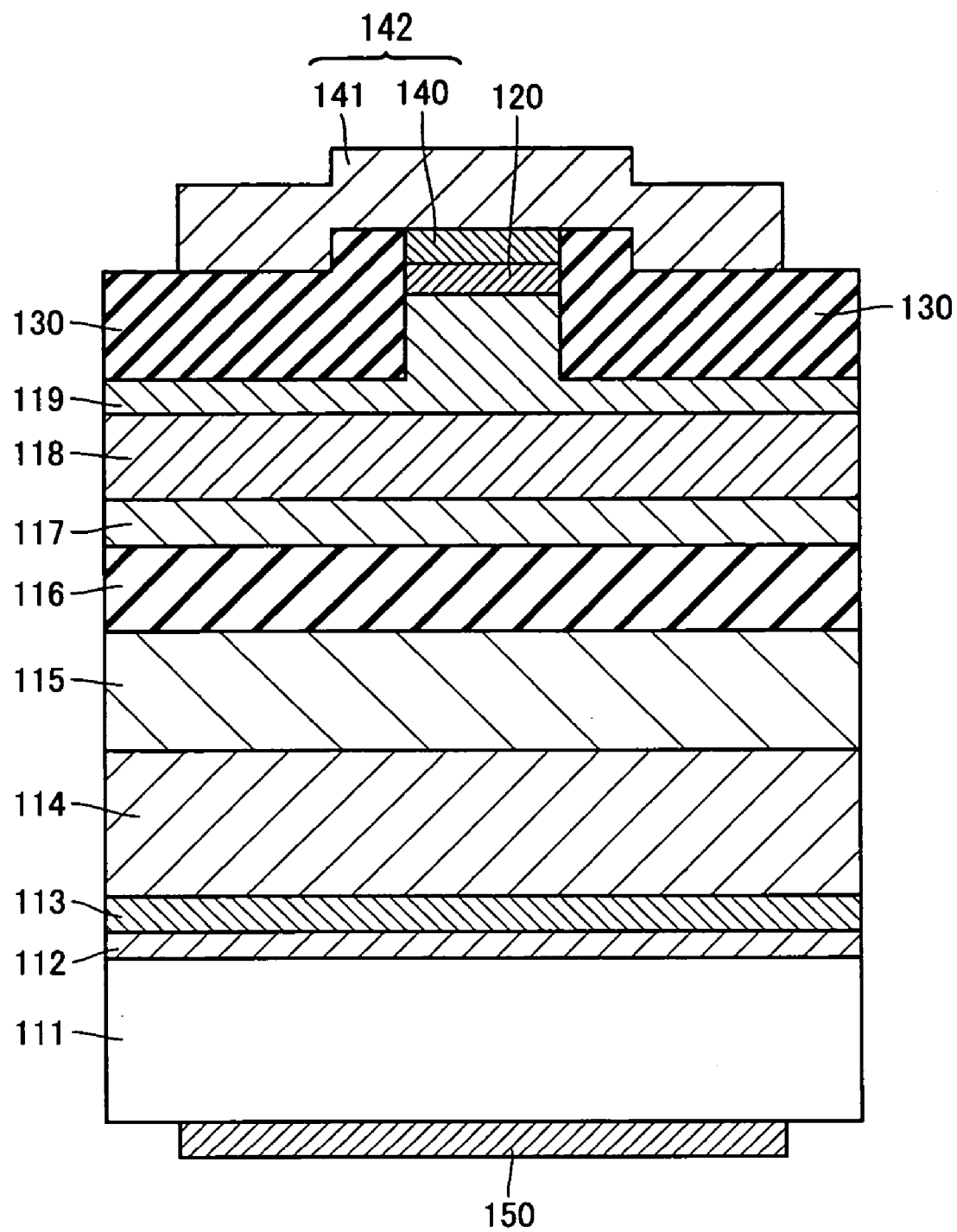
FIG. 3 is a schematic cross-sectional view showing a nitride semiconductor device according to Comparative Example 1.
Figure 4:
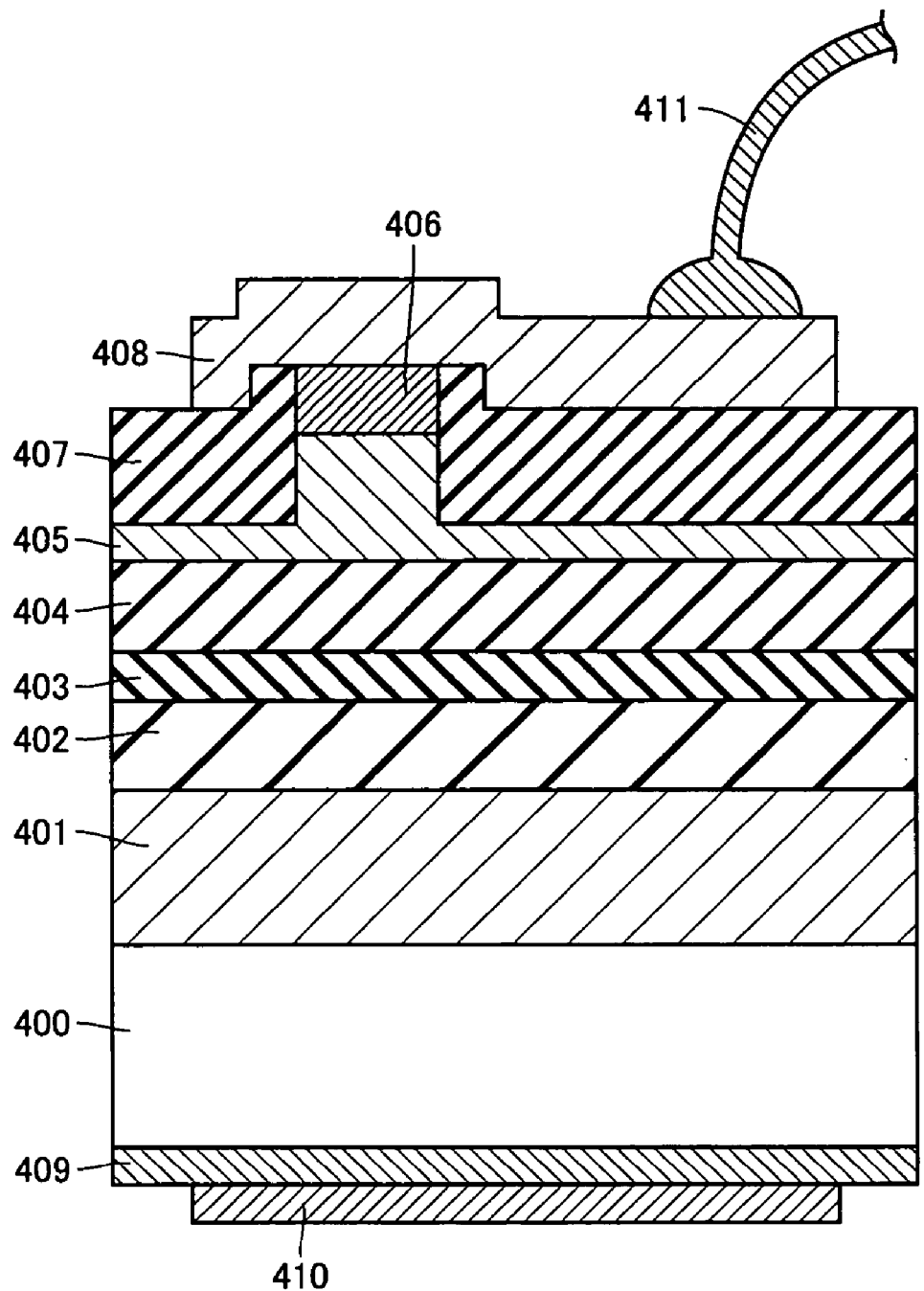
FIG. 4 is a schematic cross-sectional view showing a nitride semiconductor device according to the prior art.

FIG. 3 is the schematic cross-sectional view showing a nitride semiconductor device according to Comparative Example 1. In this nitride semiconductor device, no separation preventing layer was formed and a gold layer having a thickness of 200 nm was only used for p-side second metal layer 141. In addition, the first heat treatment was not carried out on p-side metal layer 142 made of p-side first metal layer 140 and p-side second metal layer 141, and only the second heat treatment was carried out on p-side metal layer 142. In the second heat treatment, p-side metal layer 142 was heated for 5 minutes at 550° C. after the temperature was increased to 550° C. for 5 minutes. In exactly the same manner as that of Example 1, except for the above description, the nitride semiconductor devices according to Comparative Example 1 were fabricated.

The yield of the nitride semiconductor devices according to this Comparative Example 1 were inspected for each lot in the same manner as in Example 1. The result of this is shown in FIG. 2. As shown in FIG. 2, the nitride semiconductor devices were fabricated with a yield as low as approximately 5% to 25% for each and every lot (lot nos. 1 to 11) according to Comparative Example 1.

(Others)

According to the result of FIG. 2, it is considered that a nitride semiconductor device where silicon oxide is used for insulating layer 130, titanium oxide is used for separation preventing layer 131, and a layered structure of a molybdenum layer and a gold layer is used for p-side second metal layer 141, which are a combination shown in Example 1, has a configuration that can be manufactured with a higher yield as well as a higher operational stability and reliability.

In addition, in Example 1, the molybdenum layer in p-side metal layer 142 effectively functions as a barrier layer for suppressing the mutual diffusion of elements between the palladium layer in p-side first metal layer 140 that makes contact with p-type GaN contact layer 120 and the gold layer in p-side second metal layer 141. In this manner, the molybdenum layer in p-side metal layer 142 functions both as a barrier layer and a layer for increasing adhesion to separation preventing layer 131 and therefore, it is preferable to use such a layer in a ridge stripe type laser diode having a ridge stripe portion as Example 1. In addition, it is possible that a titanium layer, a tungsten layer, a platinum layer or the like function as a barrier layer in the same manner as a molybdenum layer in the case where these layers are used instead of a molybdenum layer.

In addition, though n-type GaN substrate 111 was used as the substrate in the above description, an insulating substrate such as a sapphire substrate or a spinel substrate can be used. Here, in the case where an insulating substrate is used, etching is carried out until the surface of n-type GaN layer 113 of the nitride semiconductor device is exposed, and n-side metal layer 150 is formed on the exposed surface of n-type GaN layer 113.

In addition, though buffer layer 112 was formed in the above description, the same results as described above can be gained without forming buffer layer 112 in the case where a nitride semiconductor substrate such as a GaN substrate is used.

In addition, though the first and second heat treatments were carried out after the formation of n-side metal layer 150 in the above description, n-side metal layer 150 may be formed after the first and second heat treatments have been carried out.

In addition, though a palladium layer was used as the layer in p-side first metal layer 140 that makes contact with p-type GaN contact layer 120 in Example 1, the same effects as described above can be gained by using a cobalt layer, a platinum layer, a nickel layer or the like.

In addition, it is preferable that the thicknesses t1 and t2 of insulating layer 130 shown in FIG. 1 are no smaller than 80 nm and no greater than 400 nm according to Examples 1 to 3. In the case where the thicknesses t1 and t2 of insulating layer 130 are less than 80 nm, it becomes difficult to maintain the insulating properties of insulating layer 130, and the reduction in the manufacturing yield of the nitride semiconductor devices tends to be induced due to the occurrence of a current leak and the like. Furthermore, light that is generated in active layer 116 easily spreads to p-side second metal layer 141 which is outside of insulating layer 130 and the loss of light in p-side second metal layer 141 due to absorption tends to become great. Meanwhile, in the case where the thicknesses t1 and t2 of insulating layer 130 are greater than 400 nm, insulating layer 130 is too thick to make the occurrence of a deformity or cracking easier in insulating layer 130 due to the difference in the thermal expansion coefficient between insulating layer 130 and the nitride semiconductor layer that makes contact with insulating layer 130 in the case where insulating layer 130 is heated in the manufacturing process of the nitride semiconductor device, and thereby, the manufacturing yield of the nitride semiconductor devices tends to be lowered.

In addition, it is preferable that the thicknesses t3 and t4 of separation preventing layer 131 shown in FIG. 1 are no smaller than 10 nm and no greater than 400 nm in Examples 1 to 3. In the case where the thicknesses t3 and t4 of separation preventing layer 131 are less than 10 nm, the effects of increasing adhesion to p-side second metal layer 141 tend not to be sufficiently gained. Meanwhile, in the case where the thicknesses t3 and t4 of separation preventing layer 131 are greater than 400 nm, separation preventing layer 131 is too thick to make the occurrence of a deformity or cracking easier in separation preventing layer 131 due to the difference in the thermal expansion coefficient between separation preventing layer 131 and layers that make contact with separation preventing layer 131 in the case where separation preventing layer 131 is heated in the manufacturing process of the nitride semiconductor element, and thereby, the manufacturing yield of the nitride semiconductor element tends to be lowered. Here, though a variety of methods for forming a thin film can be used as the methods for forming the insulating layer and the separation preventing layer, the thicknesses (t1 and t3, hereinafter referred to as "thicknesses at the bottom") at the bottom of the ridge stripe portion and the thicknesses (t2 and t4, hereinafter referred to as "thicknesses on the sides") are different from each other due to a difference in the coverage for a step according to some of the aforementioned formation methods. In the case of the formation by means of a sputtering method, for example, the coverage for the sides of the ridge stripe portion is excellent, making no great difference between the thicknesses at the bottoms and on the sides, whereas in the case of the formation by means of, for example, a vacuum vapor deposition method, the coverage for the sides of the ridge stripe portion is insufficient, making in some cases the thicknesses on the sides is thin relative to the thicknesses at the bottom. Even in this case, it is preferable that t1, t2, t3, and t4 satisfy the aforementioned ranges.

According to the present invention, adhesion between the insulating layer on the nitride semiconductor layer and the metal layer is increased, and thereby, separation between the insulating layer and the metal layer, and a wire bonding failure can be prevented and therefore, a nitride semiconductor device can be manufactured with a high yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride semiconductor device comprising:
a nitride semiconductor layer, an insulating layer, a separation preventing layer, and a metal layer,
wherein the nitride semiconductor layer is formed on a first surface of a substrate, the nitride semiconductor layer has a projecting portion and a recessed portion, the projecting portion has an upper surface and side surfaces, the recessed portion has lower surfaces adjacent to and extending from the side surfaces of the projecting portion, and the nitride semiconductor layer has the insulating layer and the metal layer thereon;
wherein the insulating layer is formed directly on the lower surfaces of the recessed portion and the side surfaces of the projecting portion, and the insulating layer is configured to expose the upper surface of the projecting portion;
wherein the separation preventing layer is formed directly on the insulating layer above the lower surfaces of the recessed portion, the separation preventing layer is formed directly between the insulating layer and the metal layer, the separation preventing layer is configured to expose the upper surface of the projecting portion, the separation preventing layer is not in contact with sidewalls of the nitride semiconductor layer, and the separation preventing layer includes, as a main component, at least one metal oxide selected from the group consisting of oxides of tungsten, molybdenum, chromium, titanium, nickel, hafnium, zinc, indium, and yttrium;
wherein the metal layer is formed directly on the separation preventing layer and on the upper surface of the projecting portion, a portion of the metal layer is formed directly on the separation preventing layer on the insulating layer above the lower surfaces of the recessed portion, the portion of the metal layer has a contact surface in which the portion of the metal layer is in contact with an upper surface of the separation preventing layer, and the contact surface has, as a main component, at least one metal selected from the group consisting of molybdenum and;
wherein a thickness of the insulating layer is greater than that of the separation preventing layer; and
wherein the insulating layer and the separation preventing layer are formed of different materials.

2. The nitride semiconductor device according to claim 1, wherein
said insulating layer includes a material selected from a group consisting of silicon oxide, aluminum oxide, zirconium oxide, tantalum oxide, magnesium oxide, calcium fluoride and magnesium fluoride.

3. The nitride semiconductor device according to claim 1, wherein
said insulating layer is silicon oxide and said separation preventing layer is titanium oxide.

4. The nitride semiconductor device according to claim 1, wherein the nitride semiconductor device is a laser diode including a ridge stripe portion having opposed side surfaces that are formed by removing a part of the nitride semiconductor layer, and
wherein at least one portion of the side surfaces of said ridge stripe portion is filled with said insulating layer.

5. The nitride semiconductor device according to claim 1, wherein a thickness of the insulating layer ranges from 80 to 400 nm.

6. The nitride semiconductor device according to claim 1, wherein a thickness of the separation preventing layer ranges from 10 to 400 nm.

7. The nitride semiconductor device according to claim 1, wherein the contact surface has, as a main component, at least one metal selected from the group consisting of molybdenum, hafnium, aluminum, tantalum, and vanadium.

8. The nitride semiconductor device according to claim 1, wherein the metal layer is in a form of a single layer.

9. The nitride semiconductor device according to claim 8, wherein the metal layer directly contacts the insulating layer.

10. The nitride semiconductor device according to claim 8, wherein the metal layer contacts an entire uppermost surface of the insulating layer.

11. A nitride semiconductor device comprising:
a nitride semiconductor layer, a first metal layer, an insulating layer, a separation preventing layer, and a second metal layer,
wherein the nitride semiconductor layer is formed on a first surface of a substrate, the nitride semiconductor layer has a projecting portion and a recessed portion, the projecting portion has an upper surface and side surfaces, the recessed portion has lower surfaces adjacent to and extending from the side surfaces of the projecting portion, and the nitride semiconductor layer has the insulating layer and the first metal layer thereon;

wherein the first metal layer is formed directly on the upper surface of the projecting portion, an upper surface of the first metal layer has a width equal to that of the upper surface of the projecting portion, and the second metal layer is on the upper surface of the first metal layer;

wherein the insulating layer is formed directly on the lower surfaces of the recessed portion and the side surfaces of the projecting portion, and the insulating layer is configured to expose the upper surface of the projecting portion;

wherein the separation preventing layer is formed directly on the insulating layer above the lower surfaces of the recessed portion, the separation preventing layer is formed directly between the insulating layer and the second metal layer, the separation preventing layer is configured to expose the upper surface of the projecting portion, the separation preventing layer is not in contact with sidewalls of the nitride semiconductor layer, and the separation preventing layer includes, as a main component, at least one metal oxide selected from the group consisting of oxides of tungsten, molybdenum, chromium, titanium, nickel, hafnium, zinc, indium, and yttrium;

wherein the second metal layer is formed directly on the separation preventing layer and on the upper surface of the projecting portion, a portion of the second metal layer is formed directly on the separation preventing layer on the insulating layer above the lower surfaces of the recessed portion, the portion of the second metal layer has a contact surface in which the portion of the second metal layer is in contact with an upper surface of the separation preventing layer, and the contact surface has, as a main component, at least one metal selected from the group consisting of molybdenum and hafnium, wherein a thickness of the insulating layer is greater than that of the separation preventing layer, and wherein the insulating layer and the separation preventing layer are formed of different materials.

12. The nitride semiconductor device according to claim 11 wherein:

said insulating layer is made of a material selected from the group consisting of silicon oxide, aluminum oxide, zirconium oxide, tantalum oxide, magnesium oxide, calcium fluoride and magnesium fluoride.

13. The nitride semiconductor device according to claim 11 wherein:

said insulating layer is silicon oxide and said separation preventing layer is titanium oxide.

14. The nitride semiconductor device according to claim 11, which is a laser diode having a ridge stripe portion having opposed side surfaces that is formed by removing a part of said at least one nitride semiconductor layer, wherein at least one portion of the side surfaces of said ridge stripe portion is filled in with said insulating layer.

15. The nitride semiconductor device according to claim 11, wherein a thickness of the insulating layer ranges from 80 to 400 nm.

16. The nitride semiconductor device according to claim 11, wherein a thickness of the separation preventing layer ranges from 10 to 400 nm.

17. The nitride semiconductor device according to claim 11, wherein the contact surface has, as a main component, at least one metal selected from the group consisting of molybdenum, hafnium, aluminum, tantalum, and vanadium.

18. The nitride semiconductor device according to claim 11, wherein the first metal layer does not overlap the insulating layer.

19. The nitride semiconductor device according to claim 11, wherein the second metal layer directly contacts the insulating layer.

20. The nitride semiconductor device according to claim 11, wherein the separation preventing layer does not contact the first metal layer.

* * * * *